United States Patent
Matsumoto

(10) Patent No.: US 6,573,487 B2
(45) Date of Patent: Jun. 3, 2003

(54) IMAGE SENSOR USED FOR IMAGE INPUTTING DEVICE

(75) Inventor: Toshio Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/895,023

(22) Filed: Jul. 2, 2001

(65) Prior Publication Data

US 2002/0092967 A1 Jul. 18, 2002

(30) Foreign Application Priority Data

Jan. 18, 2001 (JP) ........................................ 2001-010531

(51) Int. Cl.[7] .............................................. H01L 27/00
(52) U.S. Cl. ...................... 250/208.1; 250/216; 358/484
(58) Field of Search ............................... 250/208.1, 216, 250/239, 227.2; 358/484, 483, 474, 471, 482, 296; 348/294

(56) References Cited

U.S. PATENT DOCUMENTS 5,517,329 A * 5/1996 Ishizuka ..................... 358/474
5,579,114 A * 11/1996 Imamura ..................... 358/482
5,780,840 A * 7/1998 Lee et al. ................. 250/208.1
5,825,510 A * 10/1998 Imamura ..................... 358/471

* cited by examiner

Primary Examiner—Kevin Pyo
Assistant Examiner—Seung C. Sohn
(74) Attorney, Agent, or Firm—Oblon, Spivak, McClelland, Maier & Neustadt, P.C.

(57) ABSTRACT

A sensor frame has a first frame portion and a second frame portion, and a rod lens array extending in a longitudinal direction is arranged and fixed between the first and second frame portions. An L-shaped plate having a first plate-shaped portion and a second plate-shaped portion is arranged below the rod lens array. A sensor substrate is placed on the first plate-shaped portion, and a sensor IC is held on the sensor substrate so as to receive rays of light reflected on a manuscript and passing through the rod lens array. The second plate-shaped portion is fixed on an end surface of the first frame portion by a plurality of screws arranged along the longitudinal direction. A diameter of each screw hole formed in the second plate-shaped portion is larger than that of the corresponding screw so as to allow that the height of the sensor IC is adjusted by moving up and down the second plate-shaped portion before the fixing of the second plate-shaped portion. Because the position of the sensor IC merely held on the sensor substrate is adjusted, the distance between the rod lens array and the light receiving element can be correctly adjusted, and light and shade information of an image drawn in a manuscript can be correctly obtained in the image sensor.

9 Claims, 7 Drawing Sheets

IMAGE SENSOR USED FOR IMAGE INPUTTING DEVICE

BACKGROUND OF THE INVENTION

1. Field of the Invention

The present invention relates to an image sensor used for an image inputting unit of an image inputting device.

2. Description of Related Art

FIG. 8 is a cross-sectional view showing the configuration of an image sensor disclosed in Published Unexamined Japanese Patent Application No. H4-111664 (1992) as a first prior art. FIG. 9 is a side view seen from the F direction in FIG. 8. In FIG. 8 and FIG. 9, 101 indicates an image sensor, 102 indicates a glass plate placed along a manuscript running plane, and 103 indicates a sensor frame. 104 indicates a line light source composed of a plurality of light emitting diodes (LED) arranged in a line. A surface of a manuscript 113 running on the glass plate 102 is illuminated with light emitted from the line light source 104. 105 indicates a holding member which is fixed on the sensor frame 103 and holds the line light source 104. 106 indicates a rod lens array composed of a plurality of rod lenses arranged in a line. A plurality of rays of light reflected on the surface of the manuscript 113 are converged by the rod lens array 106 to form an erecting image at equal magnification. 107 indicates a long groove formed in the sensor frame 103, and the rod lens array 106 is arranged in the long groove 107. 108 indicates a long hole formed in the sensor frame 103, and the light emitted from the rod lens array 106 passes through the long hole 108. 109 indicates each of a plurality of screws for fixing the rod lens array 106 to the sensor frame 103. 110 indicates a sensor integrated circuit (IC) composed of a plurality of light receiving devices arranged in a line. The rays of light, which are reflected on the surface of the manuscript 113 and pass through the rod lens array 106, are received in the sensor IC 110. 111 indicates a sensor substrate on which the sensor IC 110 is mounted. 112 indicates each of a pair of side plates arranged on both ends of the sensor frame 103 in a longitudinal direction of the rod lens array 106 (or a direction perpendicular to a plane shown in FIG. 8).

Also, FIG. 10 is a cross-sectional view showing the configuration of another image sensor disclosed in the Published Unexamined Japanese Patent Application No. H4-111664 (1992) as a second prior art. FIG. 11 is a side view seen from the G direction in FIG. 10. In FIG. 10 and FIG. 11, 121 indicates an image sensor. 122 indicates each of a pair of springs attached to the side plates 112 respectively. The springs 122 push both end portions of the rod lens array 106. 123 indicates each of a pair of screws for pushing the rod lens array 106 toward the springs 122 to fix the rod lens array 106 between the springs 122 and the screws 123. The other constituent elements, which are equivalent to or the same as those shown in FIG. 8 or FIG. 9, are indicated by the same reference numerals as those of the constituent elements shown in FIG. 8 or FIG. 9, and additional description of those constituent elements is omitted.

The focus adjustment performed in the image sensors 101 and 121 is described with reference to FIG. 12.

FIG. 12 is a view showing an operation of the rod lens array 106. As shown in FIG. 12, rays of light reflected on the surface of the manuscript 113 at a point P pass through the rod lens array 106 and are converged at a point Q to form an image. Here, an optical distance X from the point P to the center of the rod lens array 106 is equal to an optical distance Y from the center of the rod lens array 106 to the point Q. Therefore, in the assembly operation of each of the image sensors 101 and 121, the position of the rod lens array 106 is adjusted so as to place the sensor IC 110 at an image forming position at which the rays of light reflected on the surface of the manuscript 113 is converged. Therefore, the image sensor is brought into focus.

In detail, in the first prior art, the rod lens array 106 is moved up and down as shown by double-headed arrows in FIG. 9. Thereafter, when the sensor IC 110 is placed at an image forming position at which the rays of light reflected on the surface of the manuscript 113 are converged, the rod lens array 106 is pushed on a wall of the sensor frame 103 opposite to the screws 109 so as to fix the position of the rod lens array 106. Therefore, the image sensor 101 is adjusted so as to place the sensor IC 110 at the image forming position at which the rays of light reflected on the surface of the manuscript 113 are converged.

Also, in the second prior art, the rod lens array 106 receives a resilient force of the springs 122. Therefore, when the screws 123 are driven, the rod lens array 106 is moved up as shown by double-headed arrows in FIG. 11. In contrast, when the screws 123 are loosened, the rod lens array 106 is moved down as shown by double-headed arrows in FIG. 11. Therefore, when the sensor IC 110 is placed at an image forming position at which the rays of light reflected on the surface of the manuscript 113 are converged, the turning of the screws 123 is stopped. Therefore, the position of the rod lens array 106 is adjusted so as to place the sensor IC 110 at the image forming position at which the rays of light reflected on the surface of the manuscript 113 are converged.

Next an operation of each of the image sensors 101 and 121 is described.

When the manuscript 113 runs on the glass plate 102, the surface of the manuscript 113 is illuminated with rays of light emitted from the line light source 104 through the glass plate 102. The rays of light are reflected on the surface of the manuscript 113 and have intensities corresponding to light and shade conditions of an image drawn in the manuscript 113. The rays of light reflected on the surface of the manuscript 113 passes through the rod lens array 106 and the long hole 108 of the sensor frame 103 and are converged on the sensor IC 110 to form the image of the manuscript 113, and the reflected light is received in the sensor IC 110. Thereafter, a photoelectric conversion is performed in the sensor IC 110 for the light reflected on the surface of the manuscript 113 according to the intensities of the rays of reflected light, and light and shade information of the image drawn in the manuscript 113 is output to the outside through the sensor substrate 111.

Because the image sensor 101 of the first prior art has the above configuration, there are following problems.

FIG. 13 is a top view of the image sensor 101 and shows the long groove 107 and the long hole 108 in a screw driving condition. FIG. 14 is an enlarged top view of an end of the long hole 108 shown in FIG. 13.

As shown in FIG. 13, when the screws 109 are driven, the long groove 107 and the long hole 108 are widened, and an opening is generated between the sensor frame 103 and the rod lens array 106. As shown in FIG. 14, the long hole 108 of the sensor frame 103 does not reach any side plate 112 placed on both sides of the sensor frame 103 but is surrounded by the sensor frame 103 at both ends of the long hole 108. Therefore, an area of the opening at the center of the long groove 107 and the long hole 108 is wider than that at both ends of the long groove 107 and the long hole 108. Therefore, light leaks through the opening between the sensor frame 103 and the rod lens array 106, and the leaking light overlaps with the light which is reflected on the manuscript 113 and is converged by the rod lens array 106 on the sensor IC 110. As a result, a problem has arisen that the light and shade information indicating the image drawn in the manuscript 113 cannot be correctly obtained in the image sensor 101.

Also, when the screws 109 are driven, the top portions of the screws 109 are rotated on the surface of the rod lens array 106. Therefore, a surface portion of the rod lens array 106 is scraped by the screws 109 and results in the generation of foreign particulate matter. This foreign particulate matter passes through the opening between the sensor frame 103 and the rod lens array 106 and lay thick on the sensor IC 110. Therefore, another problem has arisen that the foreign particulate matter prevents the light and shade information indicating the image drawn in the manuscript 113 from being received in the sensor IC 110.

Also, when the screws 109 are driven, the long groove 107 and the long hole 108 are widened, and an external shape of the sensor frame 103 is deformed. As shown in FIG. 13, a width I at the center of the sensor frame 103 becomes longer than a width H at each end of the sensor frame 103. The difference between the widths I and H depends on a clamping torque of the screws 109. Therefore, another problem has arisen that it is difficult to design shapes for parts which are disposed adjacent to the image sensor 101.

Also, in the second prior art, because the image sensor 121 has the above configuration, only each end of of the rod lens array 106 is fixed by the springs 122 and the screws 123. Therefore, in cases where the image sensor 121 which is lengthen in the longitudinal direction is used, a rod lens array 106 with corresponding lengthening in the longitudinal direction is used. Therefore, a considerable warp results in the rod lens array 106 due to the weight of the rod lens array 106 with the result that the rod lens array 106 is finally bent. In this case, a problem has arisen that the position of the rod lens array 106 cannot be adjusted so as to correctly place all the light receiving devices of the sensor IC 110 at the image forming positions of the light reflected on the manuscript 113 along the whole extending range of the rod lens array 106. In other words, a problem has arisen that the image sensor 121 cannot be focused on the manuscript 113 along the whole rod lens array 106 in the longitudinal direction.

Also, because the rod lens array 106 is lengthened in the longitudinal direction when both ends of the rod lens array 106 are fixed by the springs 122 and the screws 123, when an ambient temperature changes, the rod lens array 106 is bent due to the difference in coefficient of linear thermal expansion between the sensor frame 103 and the rod lens array 106. Therefore, another problem has arisen that the sensor IC 110 is placed out of the image forming position at which the light reflected on the manuscript 113 is converged. In other words, another problem has arisen that the image sensor 121 cannot be focused on the manuscript 113.

SUMMARY OF THE INVENTION

A main object of the present invention is to provide, with due consideration to the drawbacks of the conventional image sensor, an image sensor in which light and shade information of an image drawn in a manuscript is correctly obtained.

Also, a first subordinate object of the present invention is to provide an image sensor in which the reception of light and shade information of an image drawn in a manuscript is not prevented.

Also, a second subordinate object of the present invention is to provide an image sensor in which an external shape of a frame is not deformed.

Also, a third subordinate object of the present invention is to provide an image sensor which is focused on a manuscript in a whole extending range of a rod lens array along a longitudinal direction.

Also, a fourth subordinate object of the present invention is to provide an image sensor which is focused on a manuscript regardless of the change of an ambient temperature.

The main object is achieved by the provision of an image sensor comprising a light source for illuminating a surface of a manuscript, a rod lens array for converging rays of light reflected on the surface of the manuscript, a light receiving element for receiving the rays of light converged by the rod lens array, a frame for fixing the rod lens array, and a holding and adjusting element for holding the light receiving element, adjusting a distance between the rod lens array and the light receiving element to arrange the light receiving element at an image forming position at which the rays of reflected light are converged so as to form an image drawn in the manuscript.

In the above configuration, the position of the rod lens array is fixed by the frame before the adjustment of the distance between the rod lens array and the light receiving element in the assembling of the image sensor. Thereafter, a position of the light receiving element is adjusted by the holding and adjusting element so as to arrange the light receiving element at the image forming position. That is, a positional adjustment of the rod lens array is not performed, but a positional adjustment of the light receiving element is performed. Because the light receiving element is merely held by the holding and adjusting element, no external force is given to the light receiving element in the assembling and adjusting of the image sensor. Accordingly, the distance between the rod lens array and the light receiving element can be correctly adjusted, and light and shade information of the image drawn in the manuscript can be correctly obtained in the image sensor.

It is preferred that the frame has both a first frame portion and a second frame portion separated from each other, and the rod lens array has a plane of incidence, a light emitting plane opposite to the plane of incident plane, a first side surface extending in parallel to a longitudinal direction and a second side surface opposite to the first side surface and is arranged between the first and second frame portions of the frame so as to make the first frame portion of the frame tightly come into contact with the first side surface of the rod lens array and so as to make the second frame portion of the frame tightly come into contact with the second side surface of the rod lens array.

In the above configuration, the first frame portion of the frame tightly comes into contact with the first side surface of the rod lens array, and the second frame portion of the frame tightly comes into contact with the second side surface of the rod lens array. In this case, no light leaks through a contacting area between the first frame portion of the frame and the first side surface of the rod lens array, and no light leaks through a contacting area between the second frame portion of the frame and the second side surface of the rod lens array. Therefore, light passing through the outside of the rod lens array does not reach the light receiving element. Also, no foreign matter passes through a contacting area between the first frame portion of the frame and the first side surface of the rod lens array, and no foreign matter passes through a contacting area between the second frame portion of the frame and the second side surface of the rod lens array. Therefore, no foreign matter is put on the light receiving element.

Accordingly, the reception of light and shade information of the image drawn in the manuscript is not prevented in the image sensor.

It is preferred that the frame has a long hole through which the rays of light emitted from the rod lens array pass, and the rod lens array tightly makes contact with a plane of the sensor frame adjacent to a side of the long hole so as to cover the side of the long hole with the rod lens array.

In the above configuration, no light leaks through a contacting area between the rod lens array and the plane of the sensor frame, and no foreign matter passes through a contacting area between the rod lens array and the plane of the sensor frame. Therefore, light passing through the outside of the rod lens array does not reach the light receiving element, and no foreign matter is put on the light receiving element.

Accordingly, the reception of light and shade information of the image drawn in the manuscript is not prevented in the image sensor.

It is preferred that the holding and adjusting element comprises a plate-shaped member having a plate-shaped holding member for holding the light receiving element, and a plate-shaped adjusting member, which is connected with the plate-shaped holding member and makes contact with an end surface of the frame, for adjusting the position of the plate-shaped holding member by moving on the end surface of the frame, and a fixing member for fixing the plate-shaped adjusting member on the end surface of the frame at a plurality of fixing positions after the plate-shaped adjusting member is moved on the end surface of the frame to adjust the distance between the rod lens array and the light receiving element and to arrange the light receiving element at the image forming position.

In the above configuration, the position of the plate-shaped holding member is adjusted by moving the plate-shaped adjusting member on the end surface of the frame, and the plate-shaped adjusting member is fixed on the end surface of the frame at a plurality of fixing positions.

Accordingly, the position of the light receiving element can be easily adjusted in the image sensor. Also, an external shape of the frame is not deformed, and shapes for parts which are disposed adjacent to the image sensor can be easily designed in the image sensor.

It is preferred that the plate-shaped adjusting member is fixed on the end surface of the frame at three fixing positions or more by the fixing member.

Accordingly, the distance between the rod lens array and the light receiving element can be correctly adjusted in the whole extending range of the rod lens array along a longitudinal direction. Also, even though an ambient temperature changes, the position of the light receiving element placed at the image forming position, at which the light reflected on the surface of the manuscript is converged, can be reliably maintained.

It is preferred that an image sensor further comprises a sealing member, arranged between the plate-shaped holding member and the frame, to seal a passage extending from an outside of the image sensor to the light receiving element.

Accordingly, the sealing member can prevent foreign particulate matter of the outside from coming into the image sensor.

It is preferred that the holding and adjusting element comprises a plate-shaped holding member for holding the light receiving element, an adjusting member for supporting the plate-shaped holding member at a plurality of supporting positions and adjusting the distance between the plate-shaped holding member and the frame so as to arrange the light receiving element at the image forming position, and an elastic member, arranged between the plate-shaped holding member and the frame, for giving a resilient force to the plate-shaped holding member and the frame to make the plate-shaped holding member be apart from the frame.

Accordingly, the position of the light receiving element can be easily adjusted in the image sensor. Also, an external shape of the frame is not deformed, and shapes for parts which are disposed adjacent to the image sensor can be easily designed in the image sensor.

It is preferred that the plate-shaped holding member is supported by the adjusting member at three supporting positions or more.

Accordingly, the distance between the rod lens array and the light receiving element can be correctly adjusted in the whole extending range of the rod lens array along a longitudinal direction. Also, even though an ambient temperature changes, the position of the light receiving element placed at the image forming position, at which the light reflected on the surface of the manuscript is converged, can be reliably maintained.

It is preferred that an image sensor further comprises a sealing member, arranged between the plate-shaped holding member and the frame, to seal a passage extending from an outside of the image sensor to the light receiving element.

Accordingly, the sealing member can prevent foreign particulate matter of the outside from coming into the image sensor.

DETAILED DESCRIPTION OF THE PREFERRED EMBODIMENTS

Embodiments of the present invention will now be described with reference to the accompanying drawings.

Embodiment 1

Figure 1:
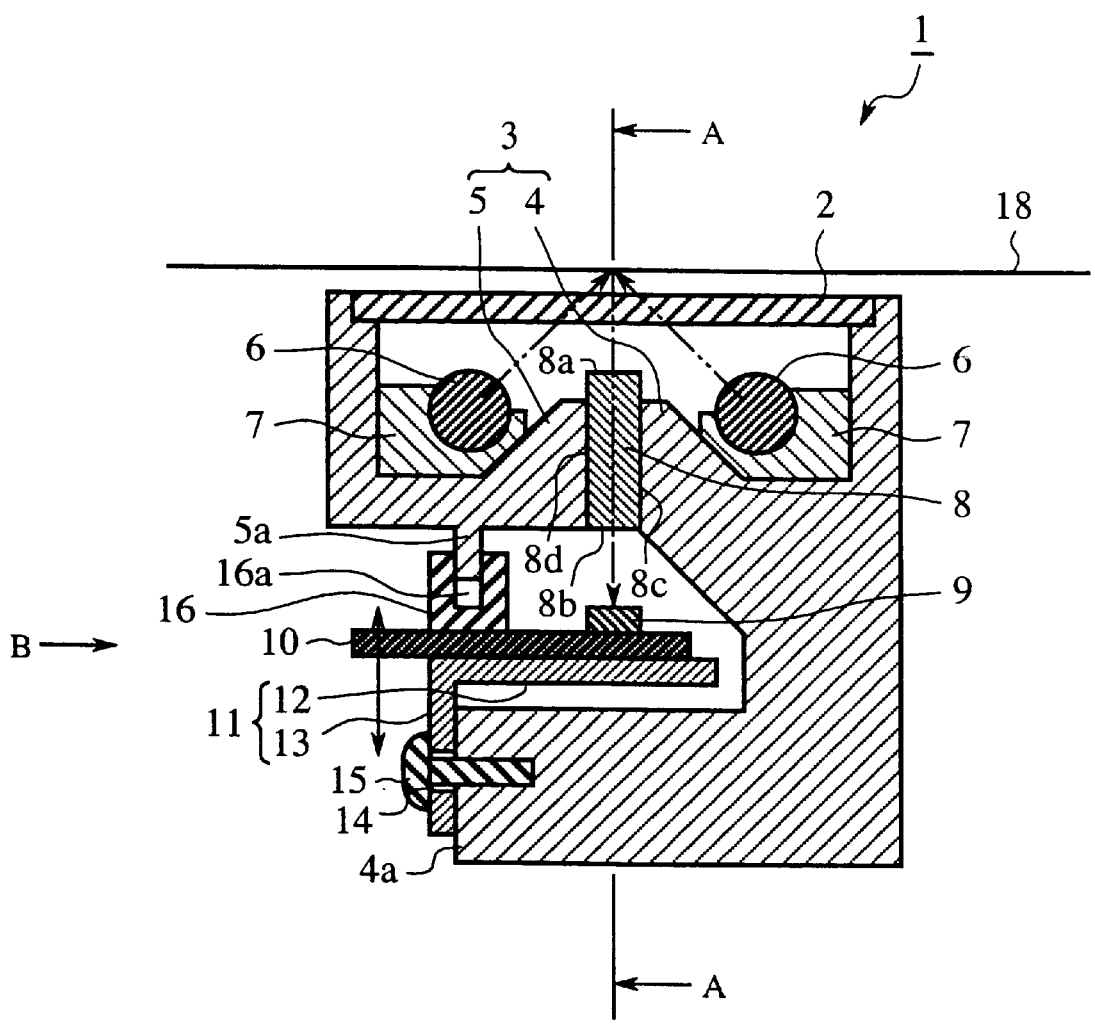
FIG. 1 is a cross-sectional view showing the configuration of an image sensor according to a first embodiment of the present invention.
Figure 2:
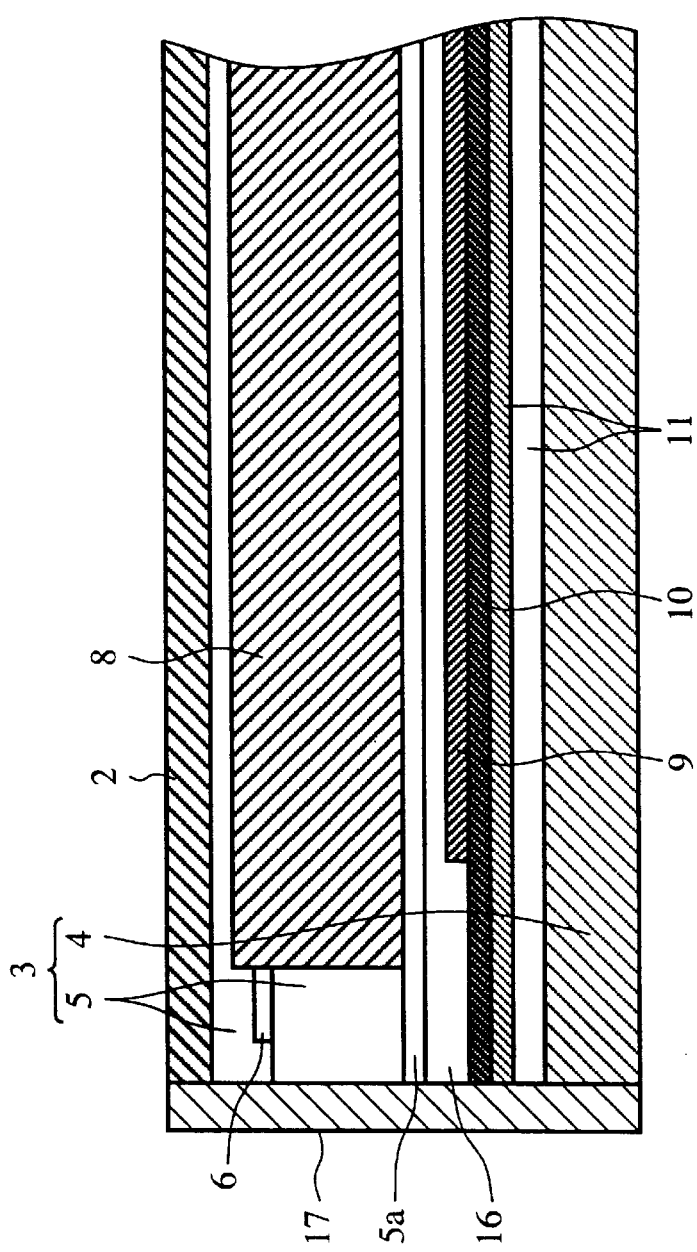
FIG. 2 is a cross-sectional view taking along line A—A in FIG. 1.
Figure 3:
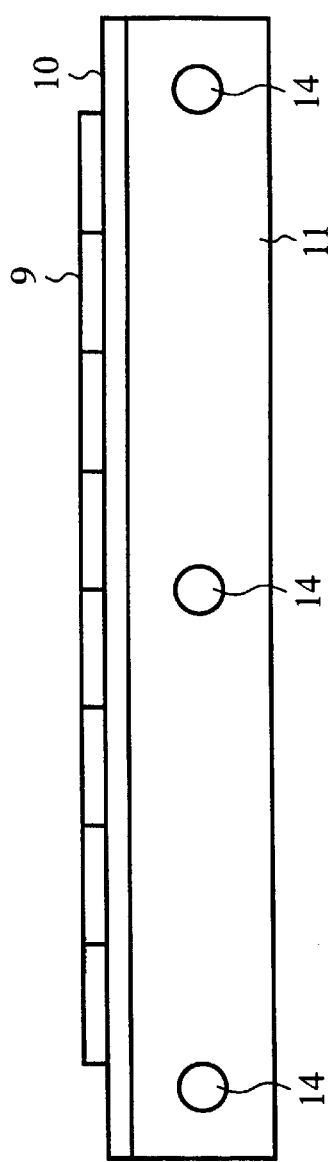
FIG. 3 is a side view seen from the B direction in FIG. 1.

FIG. 1 is a cross-sectional view showing the configuration of an image sensor according to a first embodiment of the present invention. FIG. 2 is a cross-sectional view taking along line A—A in FIG. 1. FIG. 3 is a side view seen from the B direction in FIG. 1. A main area of the image sensor is shown in FIG. 2, and a part of constituent elements of the image sensor are shown in FIG. 3.

In FIG. 1, FIG. 2 and FIG. 3, 1 indicates an image sensor, 2 indicates a glass plate placed along a manuscript running plane, and 3 indicates a sensor frame (or a frame) composed of a first frame portion 4 and a second frame portion 5 separated from each other. 6 indicates a pair of line light sources (or a light source). A surface of a manuscript 18 running on the glass plate 2 is illuminated with rays of light emitted from the line light sources 6. 7 indicates a pair of holding members which are fixed on the sensor frame 3 and hold the line light sources 6 respectively. 8 indicates a rod lens array for converging the rays of light reflected on the surface of the manuscript 18 to form an erecting image at equal magnification. 9 indicates a sensor IC (or a light receiving element) for receiving the rays of light which are reflected on the surface of the manuscript 18 and are converged by the rod lens array 8 to form the image written in the manuscript 18. 10 indicates a sensor substrate (or a plate-shaped holding member) on which the sensor IC 9 is held. 11 indicates an L-shaped plate (or a plate-shaped member) composed of a first plate-shaped portion 12 (or a plate-shaped holding member) and a second plate-shaped portion 13 (or a plate-shaped adjusting member). The sensor IC 9 and the sensor substrate 10 are held on the first plate-shaped portion 12. The second plate-shaped portion 13 is connected with the first plate-shaped portion 12 and makes contact with an end surface 4a of the first frame portion 4 of the sensor frame 3. 14 indicates each of a plurality of screw holes formed in the second plate-shaped portion 13 of the L-shaped plate 11. 15 indicates each of a plurality of screws (or a fixing member) penetrating through the screw holes 14 of the second plate-shaped portion 13 respectively. The second plate-shaped portion 13 of the L-shaped plate 11 is fixed on the end surface 14a of the first frame portion 4 of the sensor frame 3 by the screws 15. 16 indicates a spacer (a sealing member), arranged between the second frame portion 5 of the sensor frame 3 and the sensor substrate 10 so as to cover a passage extending from the outside to the sensor IC 9, for preventing external light or foreign particulate matter from coming through the passage and reaching the sensor IC 9. The covering of the passage is maintained even though the sensor substrate 10 is moved up and down with the L-shaped plate 11. 17 indicates each of a pair of side plates arranged on both ends of the sensor frame 3 respectively.

The rod lens array 8 is composed of a plurality of rod lenses arranged in a line along a longitudinal direction. A cross-sectional view on a plane perpendicular to the longitudinal direction of the rod lens array 8 is shown in FIG. 1, and the longitudinal direction of the rod lens array 8 agrees with a horizontal direction in FIG. 2. The rod lens array 8 has a plane 8a of incidence, a light emitting plane 8b opposite to the incident plane 8a, a first side surface 8c extending in parallel to the longitudinal direction and a second side surface 8d opposite to the first side surface 8c. The rod lens array 8 is arranged between the first and second frame portions 4 and 5 of the sensor frame 3 so as to make the first frame portion 4 of the sensor frame 3 tightly come into contact with the first side surface 8c of the rod lens array 8 and so as to make the second frame portion 5 of the sensor frame 3 tightly come into contact with the second side surface 8d of the rod lens array 8. Therefore, no opening is formed between the first side surface 8c of the rod lens array 8 and the first frame portion 4 of the sensor frame 3, and no opening is formed between the second side surface 8d of the rod lens array 8 and the second frame portion 5 of the sensor frame 3. To keep the tight contact of the first side surface 8c of the rod lens array 8 with the first frame portion 4 of the sensor frame 3, the first frame portion 4 of the sensor frame 3 is fixed to the first side surface 8c of the rod lens array 8 in the assembling of the-image sensor 1. Also, to keep the tight contact of the second side surface 8d of the rod lens array 8 with the second frame portion 5 of the sensor frame 3, the second frame portion 5 of the sensor frame 3 is fixed to the second side surface 8d of the rod lens array 8 in the assembling of the image sensor 1. For example, a pressure sensitive adhesive double coated tape or an adhesive material is arranged in the whole contacting area or a portion of contacting area between the first side surface 8c of the rod lens array 8 and the first frame portion 4 of the sensor frame 3, and a pressure sensitive adhesive double coated tape or an adhesive material is arranged in the whole contacting area or a portion of contacting area between the second side surface 8d of the rod lens array 8 and the second frame portion 5 of the sensor frame 3. Each of the first and second frame portions 4 and 5 has an upper concave area in which one line light source 6 and one holding member 7 are arranged. The glass plate 2 is supported by upper end portions of the first and second frame portions 4 and 5 of the sensor frame 3. A sectional shape of the sensor frame 3 perpendicular to the longitudinal direction of the rod lens array 8 is almost formed in a U shape. That is, a surface of the first frame portion 4 making contact with the rod lens array 8 extends in a lower direction along the first side surface 8c of the rod lens array 8, passes through an area placed below the sensor IC 9 and the sensor substrate 10 so as to surround the sensor IC 9, and extends to an area placed below the second frame portion 5 through an area placed below the second side surface 8d of the rod lens array 8.

Each line light source 6 extends along the longitudinal direction of the rod lens array 8. The line light source 6 is composed of a plurality of light emitting devices (LED) arranged in a line along the longitudinal direction or is formed of a fluorescent lamp extending along the longitudinal direction. However, the first embodiment is not limited to the LEDs or the fluorescent lamp. That is, any type of line light source can be used on condition that the surface of the manuscript 18 running on the glass plate 2 is illuminated with the rays of light emitted from the line light source. Also, it is applicable that only one line light source 6 be arranged in the image sensor 1. Both end portions or a plurality of portions of each line light source 6 are held by the holding member 7.

The sensor IC 9 is composed of a plurality of light receiving devices arranged along the longitudinal direction of the rod lens array 8. The rod lens array 8 does not reach each of the side plates 17, and an opening exists between each end portion of the rod lens array 8 and the corresponding side plate 17. Therefore, the length of the sensor IC in the longitudinal direction is adjusted to prevent light coming through the opening from being received in the sensor IC 9.

The sensor substrate 10 extends along the longitudinal direction of the rod lens array 8 and reaches the side plates 17 arranged on both ends of the sensor frame 3. The sensor IC 9 and the sensor substrate 10 are arranged in a concave space surrounded by the sensor frame 3 of the sectional U shape.

A sectional shape of the L-shaped plate 11 perpendicular to the longitudinal direction of the rod lens array 8 is formed in an L shape. The L-shaped plate 11 extends along the longitudinal direction of the rod lens array 8 and reaches the side plates 17 arranged on both ends of the sensor frame 3. The first plate-shaped portion 12 of the L-shaped plate 11 is perpendicular to a direction of the light passing through the rod lens array 8. The first frame portion 4 of the sensor frame 3 has the end surface 4a which is placed below the second frame portion 5 and is parallel to both the direction of the light passing through the rod lens array 8 and the longitudinal direction of the rod lens array 8. The second plate-shaped portion 13 of the L-shaped plate 11 is parallel to both the direction of the light passing through the rod lens array 8 and the longitudinal direction of the rod lens array 8 and makes contact with the end surface 4a of the first frame portion 4. A diameter of each screw hole 14 formed in the second plate-shaped portion 13 of the L-shaped plate 11 is larger than that of the corresponding screw 15. Therefore, the second plate-shaped portion 13 of the L-shaped plate 11 can be moved by the difference between the diameters of the screw hole 14 and the screw 15 on the end surface 4a of the first frame portion 4. In other words, the L-shaped plate 11 can be moved up and down by the difference between the diameters of the screw hole 14 and the screw 15. The second plate-shaped portion 13 of the L-shaped plate 11 is fixed on the end surface 4a of the first frame portion 4 by the screws 15 inserted into the screw holes 14 after the positional adjustment of the-second plate-shaped portion 13. In particular, in cases where the image sensor 1 which is lengthened in the longitudinal direction is used, the number of screw holes 14 is set to three or more, and the second plate-shaped portion 13 of the L-shaped plate 11 is fixed on the end surface 4a of the first frame portion 4 by the three screws 15 or more inserted into the screw holes 14.

The spacer 16 is arranged on the sensor substrate 10 so as to close a space between the second frame portion 5 of the sensor frame 3 and the sensor substrate 10. A sectional shape of the spacer 16 perpendicular to the longitudinal direction of the rod lens array 8 is formed in a U shape. The spacer 16 extends along the longitudinal direction of the rod lens array 8 and reaches the side plates 17 arranged on both ends of the sensor frame 3. The second frame portion 5 of the sensor frame 3 has a protruding portion 5a engaging with a concave space 16a of the spacer 16 formed in the sectional U shape. The protruding portion 5a extends along the longitudinal direction of the rod lens array 8 and reaches the side plates 17 arranged on both ends of the sensor frame 3. When a distance between the rod lens array 8 and the sensor IC 9 is adjusted, the L-shaped plate 11 is moved up and down while the concave space 16a of the spacer 16 keep engaging with the protruding portion 5a of the second frame portion 5. The spacer 16 is, for example, formed of an elastic material such as rubber. In cases where the spacer 16 formed of the elastic material is arranged so as to cover the passage extending from the outside of the image sensor 1 to the sensor IC 9 in a positional condition that a distance between the second frame portion 5 of the sensor frame 3 and the sensor substrate 10 is maximized, the spacer 16 is deformed when the distance is shortened by moving up the L-shaped plate 11. Therefore, the passage can be reliably covered with the spacer 16 during the positional adjustment of the sensor IC 9.

In this embodiment, a holding and adjusting element is composed of the sensor substrate 10, the L-shaped plate 11 and the screws 15. Also, a plate-shaped holding member is composed of the sensor substrate 10 and the first plate-shaped portion 12 of the L-shaped plate 11.

In this image sensor 1, after the image sensor 1 is assembled, the L-shaped plate 11 is moved up and down to adjust a distance between the rod lens array 8 fixed to the sensor frame 3 and the sensor IC 9. Thereafter, when the sensor IC 9 is positioned at an image forming position at which the light reflected on the surface of the manuscript 18 is converged, the screws 15 are driven so as to fix the L-shaped plate 11 on the first frame portion 4 of the sensor frame 3. Therefore, the sensor IC 9 can be correctly positioned at the image forming position at which the light reflected on the surface of the manuscript 18 is converged. That is, the image sensor 1 is brought into focus. In this case, an adjusting range of the distance between the rod lens array 8 and the sensor IC 9 is determined by the difference between the diameters of the screw holes 14 and the screws 15, the concave space 16a between the spacer 16 and the protruding portion 5a of the second frame portion 5 allows the movement of the L-shaped plate 11, and the L-shaped plate 11 is moved up and down by sliding on the end surface 4a of the first frame portion 4 of the sensor frame 3.

Next, an operation of the image sensor 1 performed after the positional adjustment of the sensor IC 9 will be described below.

When the manuscript 18 runs on the glass plate 2, the surface of the manuscript 18 is illuminated with rays of light emitted from the line light sources 6 through the glass plate 2. The rays of light are reflected on the surface of the manuscript 18 and have intensities corresponding to light and shade conditions of an image drawn in the manuscript 18. The rays of light reflected on the surface of the manuscript 18 pass through the rod lens array 8 and are converged on the sensor IC 9 to form the image of the manuscript 18, and the reflected light is received in the sensor IC 9. Thereafter, a photoelectric conversion is performed in the sensor IC 9 for the light reflected on the surface of the manuscript 18 according to the intensities of the rays of reflected light, and light and shade information of the image drawn in the manuscript 18 is output to the outside through the sensor substrate 10.

As is described above, in the first embodiment, the rod lens array 8 is fixed to the sensor frame 3 in the assembling of the image sensor 1, the L-shaped plate 11 is moved up and down so as to adjust the distance between the rod lens array 8 and the sensor IC 9, and the screws 15 are driven so as to fix the L-shaped plate 11 on the first frame portion 4 of the sensor frame 3 when the sensor IC 9 is positioned at the image forming position at which the light reflected on the surface of the manuscript 18 is converged. Accordingly, the sensor IC 9 can be correctly positioned at the image forming position, at which the light reflected on the surface of the manuscript 18 is converged, by adjusting the distance between the rod lens array 8 and the sensor IC 9. That is, the image sensor 1 can be brought into focus.

Also, in the first embodiment, the first frame portion 4 of the sensor frame 3 tightly makes contact with the first side surface 8c of the rod lens array 8 in the assembling of the image sensor 1, and the second frame portion 5 of the sensor frame 3 tightly makes contact with the second side surface 8d of the rod lens array 8 in the assembling of the image sensor 1. Therefore, no opening is formed between the first side surface 8c of the rod lens array 8 and the first frame portion 4 of the sensor frame 3, and no opening is formed between the second side surface 8d of the rod lens array 8 and the second frame portion 5 of the sensor frame 3. Therefore, no light leaks through a contacting plane between the rod lens array 8 and the first frame portion 4 of the sensor frame 3, no light leaks through a contacting plane between the rod lens array 8 and the second frame portion 5 of the sensor frame 3, and light and shade information of the image drawn in the manuscript 18 can be correctly obtained in the image sensor 1. Also, no foreign matter passes through a contacting plane between the rod lens array 8 and the first frame portion 4 of the sensor frame 3, no foreign matter passes through a contacting plane between the rod lens array 8 and the second frame portion 5 of the sensor frame 3, and no foreign matter is placed on the sensor IC 9. Accordingly, the reception of the light and shade information of the image drawn in the manuscript 18 cannot be prevented.

Also, in the first embodiment, the L-shaped plate 11 is moved up and down so as to adjust the distance between the rod lens array 8 and the sensor IC 9, and the screws 15 are driven so as to fix the L-shaped plate 11 on the first frame portion 4 of the sensor frame 3 when the sensor IC 9 is positioned at the image forming position at which the light reflected on the surface of the manuscript 18 is converged. Therefore, neither an external shape the first frame portion 4 nor an external shape the second frame portion 5 is deformed. Accordingly, shapes for parts which are disposed adjacent to the image sensor 1 can be easily designed.

Also, in the first embodiment, in cases where the image sensor 1 which is lengthened in the longitudinal direction is used, the second plate-shaped portion 13 of the L-shaped plate 11 is fixed on the end surface 4a of the first frame portion 4 by the three screws 15 or more inserted into the screw holes 14. Accordingly, even though the image sensor 1 which is lengthened in the longitudinal direction is used, the distance between the rod lens array 8 and the sensor IC 9 can be correctly adjusted in the whole extending range of the rod lens array 8 along the longitudinal direction.

Also, in the first embodiment, in cases where the image sensor 1 which is lengthened in the longitudinal direction is used, the second plate-shaped portion 13 of the L-shaped plate 11 is fixed on the end surface 4a of the first frame portion 4 by the three screws 15 or more inserted into the screw holes 14. Accordingly, even though an ambient temperature changes, the position of the sensor IC 9 placed at the image forming position, at which the light reflected on the surface of the manuscript 18 is converged, can be reliably maintained.

Also, in the first embodiment, the spacer 16 is arranged between the second frame portion 5 of the sensor frame 3 and the sensor substrate 10 so as to cover the passage extending from the outside to the image sensor 1. Therefore, the spacer 16 prevents foreign particulate matter produced in the outside from coming through the passage and reaching the sensor IC 9. Accordingly, the entry of foreign particulate matter into the image sensor 1 can be prevented.

In the first embodiment, the passage extending from the outside to the sensor IC 9 is covered with the spacer 16. However, it is applicable that the passage extending from the outside to the sensor IC 9 be covered with a sealing matter (refer to second embodiment).

Embodiment 2

Figure 4:
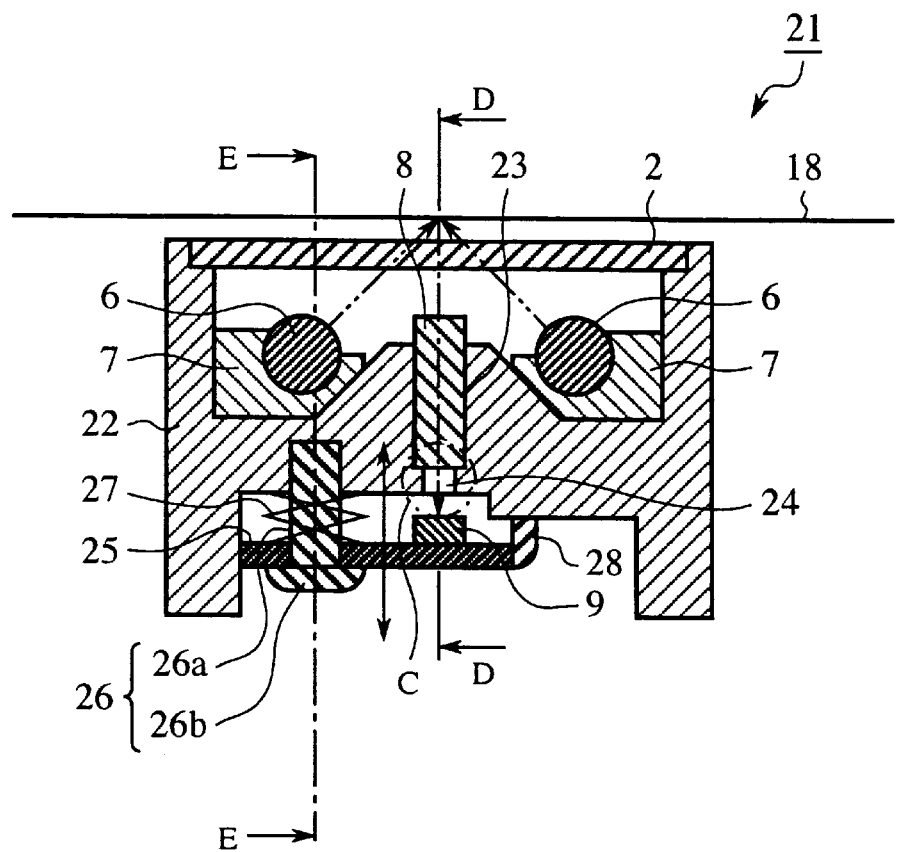
FIG. 4 is a cross-sectional view showing the configuration of an image sensor according to a second embodiment of the present invention.
Figure 5:
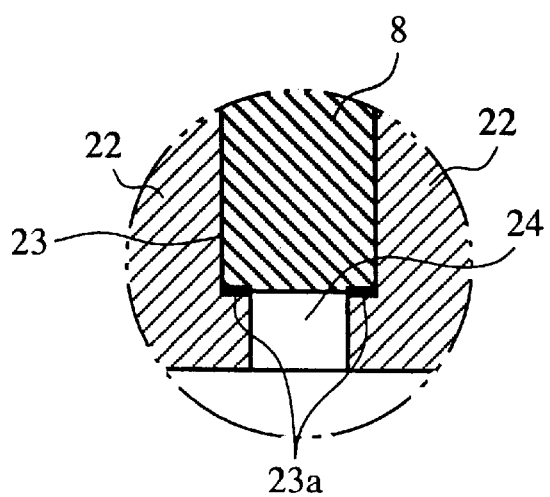
FIG. 5 is an enlarged view of a C area in FIG. 4.
Figure 6:
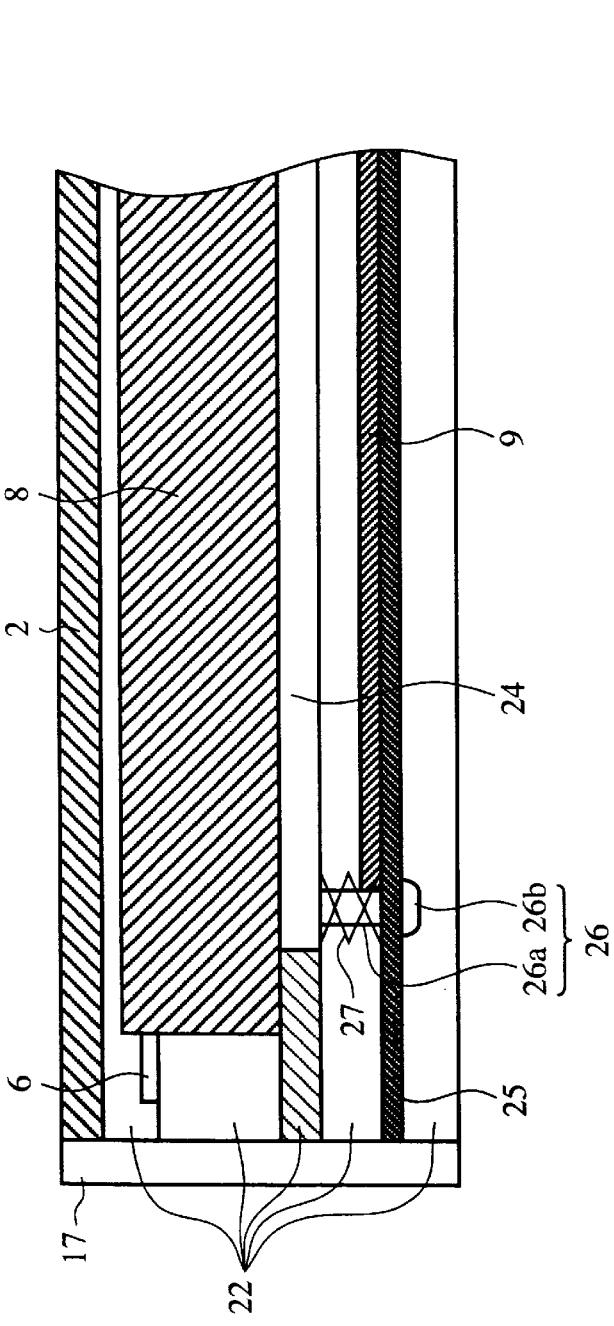
FIG. 6 is a cross-sectional view taking along line D—D in FIG. 4.
Figure 7:
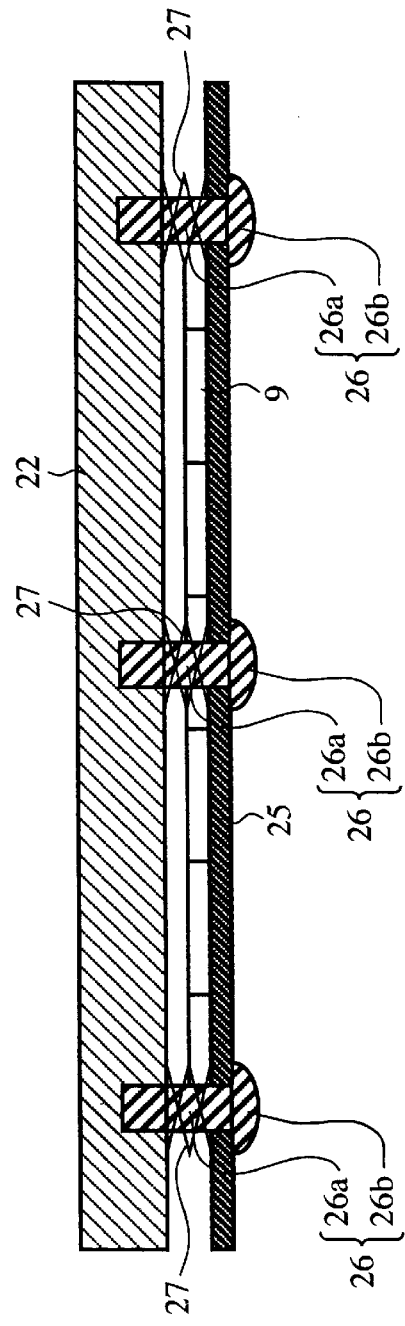
FIG. 7 is a cross-sectional view taking along line E—E in FIG. 4.
Figure 8:
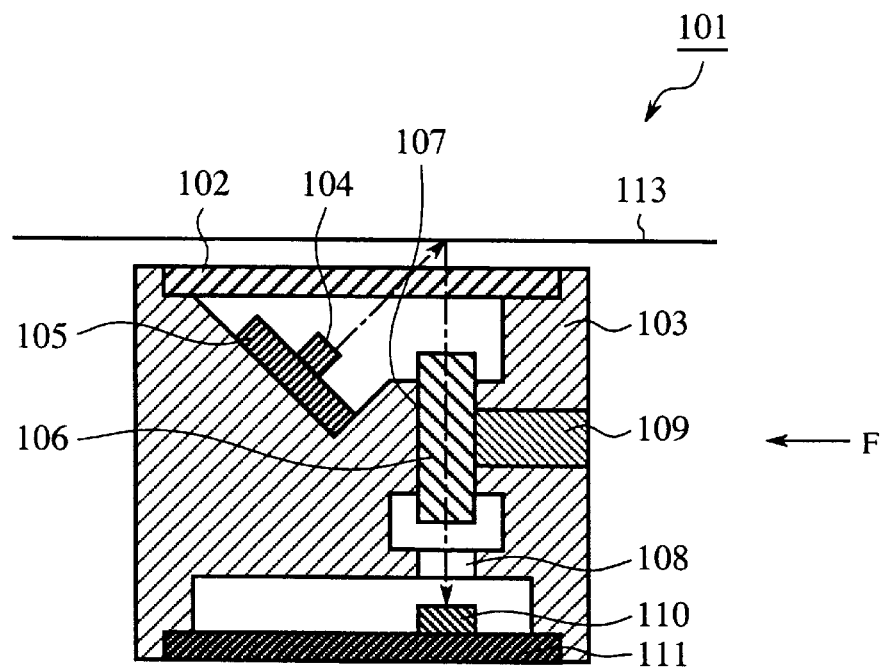
FIG. 8 is a cross-sectional view showing the configuration of an image sensor disclosed in Published Unexamined Japanese Patent Application No. H4-111664 (1992) as a first prior art.
Figure 9:
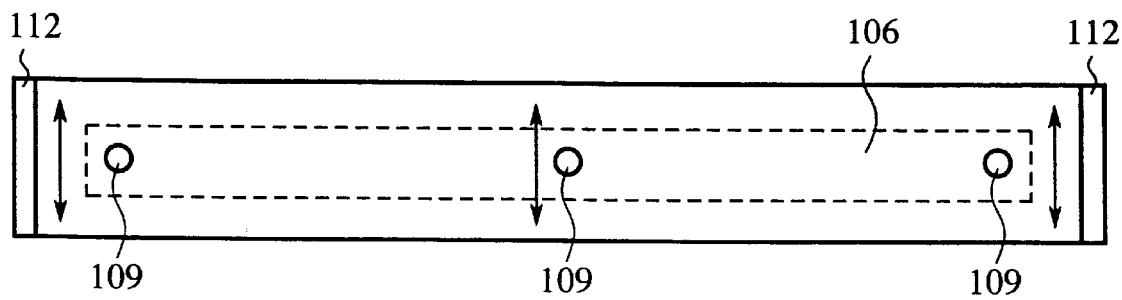
FIG. 9 is a side view seen from the F direction in FIG. 8.
Figure 10:
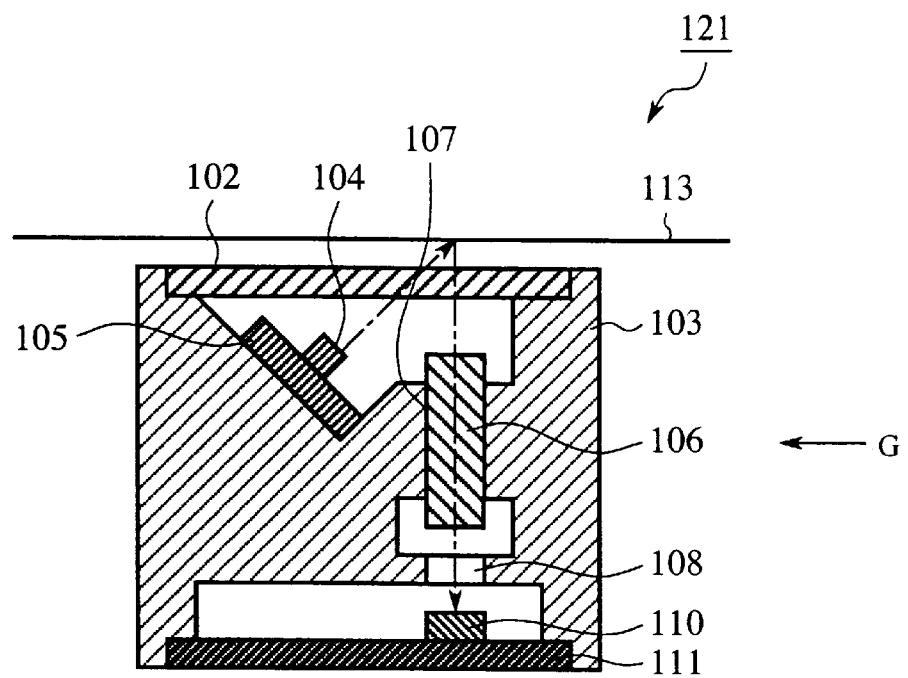
FIG. 10 is a cross-sectional view showing the configuration of another image sensor disclosed in the Published Unexamined Japanese Patent Application No. H4-111664 (1992) as a second prior art.
Figure 11:
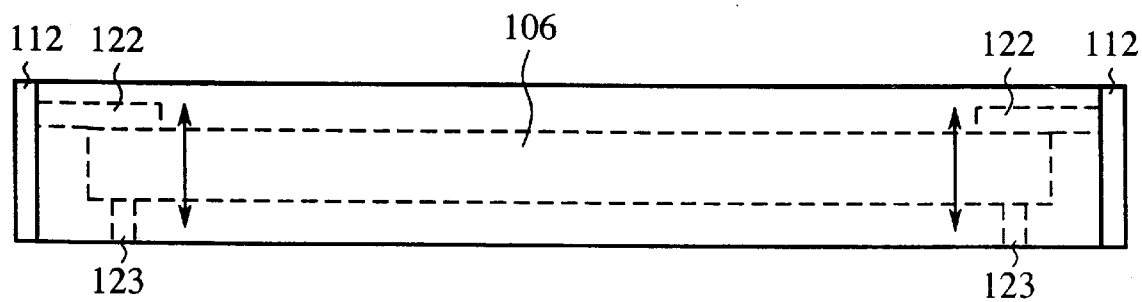
FIG. 11 is a side view seen from the G direction in FIG. 10.
Figure 12:
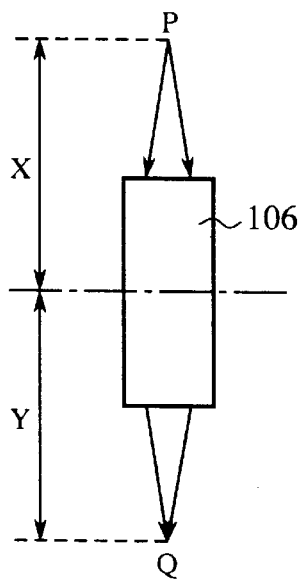
FIG. 12 is a view showing an operation of the rod lens array 106.
Figure 13:
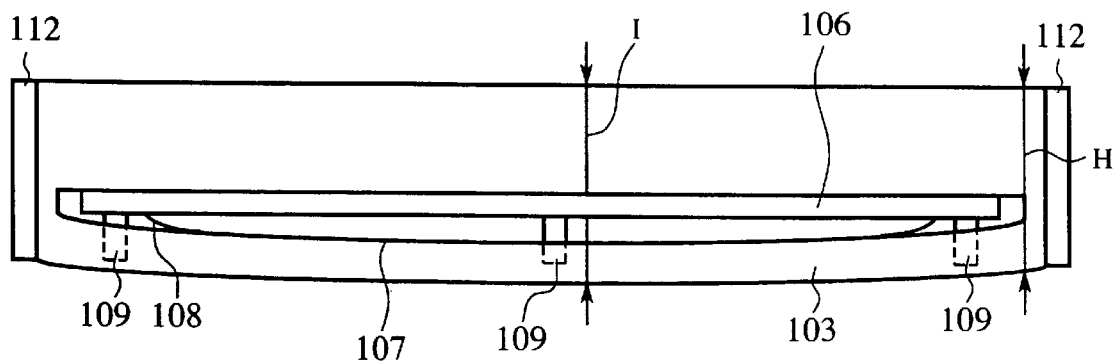
FIG. 13 is a top view of the image sensor 101 and shows the long groove 107 and the long hole 18 in a screw driving condition.
Figure 14:
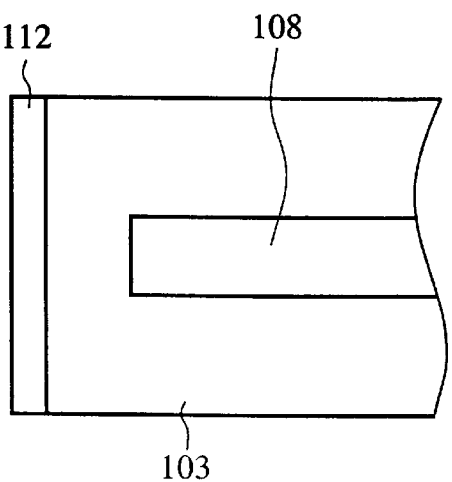
FIG. 14 is an enlarged top view of an end of the long hole 108 shown in FIG. 13.

FIG. 4 is a cross-sectional view showing the configuration of an image sensor according to a second embodiment of the present invention. FIG. 5 is an enlarged view of a C area in FIG. 4. FIG. 6 is a cross-sectional view taking along line D—D in FIG. 4. FIG. 7 is a cross-sectional view taking along line E—E in FIG. 4. A main area of the image sensor is shown in FIG. 6, and a part of constituent elements of the image sensor are shown in FIG. 7.

In FIG. 4, FIG. 5, FIG. 6 and FIG. 7, 21 indicates an image sensor, and 22 indicates a sensor frame (or a frame). 23 indicates a long groove formed in the sensor frame 22. The rod lens array 8 is arranged in the long groove 23. 24 indicates a long hole formed on a bottom side of the long groove 23, and light emitted from the rod lens array 8 passes through the long hole 24. 25 indicates a sensor substrate (a plate-shaped holding member) on which the sensor IC 9 is held. 26 indicates each of a plurality of adjusting screws (or an adjusting member) for supporting the sensor substrate 25 and adjusting a distance between the sensor substrate 25 and the sensor frame 22. 27 indicates each of a plurality of springs (or an elastic member) arranged between the sensor substrate 25 and the sensor frame 22. A resilient force is given to the sensor substrate 25 and the sensor frame 22 by the springs 27 so as to be apart from each other. 28 indicates a sealing member for sealing a passage extending from the outside to the sensor IC 9 to prevent external light or foreign particulate matter from coming through the passage and reaching the sensor IC 9.

An upper side end of the long hole 24 of the sensor frame 22, which leads to a bottom plane 23a of the long groove 23, is covered with a light emitting plane of the rod lens array 8, and the rod lens array 8 tightly makes contact with the bottom plane 23a of the long groove 23 adjacent to the long hole 24 of the sensor frame 22. Therefore, no opening is formed between the rod lens array 8 and the bottom plane 23a of the long groove 23 of the sensor frame 22. To keep the rod lens array 8 tightly contact with the bottom plane 23a of the long groove 23, the rod lens array 8 is fixed to the sensor frame 22 through a contacting plane between the rod lens array 8 and the long groove 23 of the sensor frame 22 or another plane. To fix the rod lens array 8 to the sensor frame 22, a pressure sensitive adhesive double coated tape or an adhesive material is, for example, arranged in the whole contacting plane or a portion of contacting plane between the rod lens array 8 and the long groove 23 of the sensor frame 22.

The sensor frame 22 has a pair of concave areas placed on an upper side and a concave area placed on a lower side. Each pair of line light source 6 and holding member 7 are arranged in the corresponding upper concave area, and both the sensor IC 9 and the sensor substrate 25 are arranged in the lower concave area. The glass plate 2 is supported by upper end portions of the sensor frame 22.

The sensor substrate 25 extends in the longitudinal direction of the rod lens array 8 and reaches the side plates 17 arranged on the both sides of the sensor frame 22. An emitting direction of the light emitted from the rod lens array 8 is perpendicular to a plane of the sensor substrate 25. One of both end portions of the sensor substrate 25 placed in a horizontal direction (left direction in FIG. 4) perpendicular to the longitudinal direction of the rod lens array 8 makes contact with the sensor frame 22. Each adjusting screw 26 penetrates through the sensor substrate 25 and is inserted into the sensor frame 22. Each spring 27 is arranged around a threaded portion 26a of the corresponding screw 26. The sensor substrate 25 is pushed toward a head portion 26b of each adjusting screw 26 by the resilient force of the adjusting screw 26 so as to be supported by the head portions 26b of each adjusting screws 26. Therefore, a distance between the sensor substrate 25 and the sensor frame 22 can be adjusted by turning the adjusting screw 26 so as to move up and down the sensor substrate 25. In cases where the image sensor 21 which is lengthened in the longitudinal direction of the rod lens array 8 is used, the sensor substrate 25 is supported by head portions 26b of three adjusting screws 26 or more.

The sealing member 28 is arranged between the sensor frame 22 and the other end portion of the sensor substrate 25 placed in another horizontal direction (right direction in FIG. 4) perpendicular to the longitudinal direction of the rod lens array 8. The sealing member 28 is arranged after the adjustment of the distance between the sensor substrate 25 and the sensor frame 22 is completed.

The other constituent elements, which are equivalent to or the same as those shown in FIG. 1, FIG. 2 or FIG. 3, are indicated by the same reference numerals as those of the constituent elements shown in FIG. 1, FIG. 2 or FIG. 3, and additional description of these constituent elements is omitted.

In this embodiment, a holding and adjusting element is composed of the sensor substrate 25, the adjusting screws 26 and the springs 27.

In the above configuration of the image sensor 21 according to the second embodiment, after the image sensor 21 is assembled, the distance between the sensor substrate 25 and the sensor frame 22 is adjusted by turning the adjusting screws 26. Thereafter, the turning of the adjusting screws 26 is stopped when the sensor IC 9 is positioned at the image forming position at which the light reflected on the surface of the manuscript 18 is converged, and the sealing member 28 is arranged between the sensor frame 22 and the sensor substrate 25 to close the passage extending from the outside of the image sensor 12 to the sensor IC. Accordingly, the sensor IC 9 can be correctly positioned at the image forming position, at which the light reflected on the surface of the manuscript 18 is converged, by adjusting the distance between the sensor substrate 25 and the sensor frame 22. That is, the image sensor 21 can be brought into focus. Here, when the distance between the sensor substrate 25 and the sensor frame 22 is adjusted, one end portion of the sensor substrate 25 slides on a surface of the sensor frame 22.

As is described above, in the second embodiment, the rod lens array 8 is fixed to the sensor frame 22 in the assembling of the image sensor 21, the distance between the sensor substrate 25 and the sensor frame 22 is adjusted by turning the adjusting screws 26, and the turning of the adjusting screws 26 is stopped when the sensor IC 9 is positioned at the image forming position at which the light reflected on the surface of the manuscript 18 is converged. Accordingly, the sensor IC 9 can be correctly positioned at the image forming position, at which the light reflected on the surface of the manuscript 18 is converged, by adjusting the distance between the rod lens array 8 and the sensor IC 9. That is, the image sensor 21 can be brought into focus.

Also, in the second embodiment, the upper end of the long hole 24 of the sensor frame 22 is covered with a light emitting plane of the rod lens array 8 from which the light passing through the rod lens array 8 is emitted, and the rod lens array 8 tightly makes contact with the bottom plane 23a of the long groove 23 of the sensor frame 22 adjacent to the long hole 24 of the sensor frame 22. Therefore, no opening is formed between the rod lens array 8 and the bottom plane 23a of the long groove 23 of the sensor frame 22. Accordingly, no light leaks through a contacting area between the rod lens array 8 and the sensor frame 22, and light and shade information of the image drawn in the manuscript 18 can be correctly obtained. Also, because no foreign matter passes through the contacting area between the rod lens array 8 and the sensor frame 22, there is no probability that foreign particulate matter is put on the sensor IC 9. Accordingly, the reception of the light and shade information of the image drawn in the manuscript 18 is not prevented.

Also, in the second embodiment, the distance between the sensor substrate 25 and the sensor frame 22 is adjusted by turning the adjusting screws 26, the turning of the adjusting screws 26 is stopped when the sensor IC 9 is positioned at the image forming position at which the light reflected on the surface of the manuscript 18 is converged, and the sensor IC 9 is positioned at the image forming position. Therefore, an external shape of the sensor frame 22 is not deformed when the sensor IC 9 is positioned at the image forming position. Accordingly, shapes for parts which are disposed adjacent to the image sensor 21 can be easily designed.

Also, in the second embodiment, in cases where the image sensor 21 which is lengthened in the longitudinal direction of the rod lens array 8 is used, the sensor substrate 25 is supported by the head portions 26b of three adjusting screws 26 or more. Accordingly, even though the image sensor 21 which is lengthened in the longitudinal direction of the rod lens array 8 is used, the distance between the rod lens array 8 and the sensor IC 9 can be correctly adjusted in the whole extending range of the rod lens array 8 along the longitudinal direction.

Also, in the second embodiment, in cases where the image sensor 21 which is lengthened in the longitudinal direction of the rod lens array 8 is used, the sensor substrate 25 is supported by the head portions 26b of three adjusting screws 26 or more. Accordingly, even though an ambient temperature changes, the position of the sensor IC 9 placed at the image forming position can be reliably maintained.

Also, in the second embodiment, the sealing member 28 is arranged between the other end portion of the sensor substrate 25 and the sensor frame 22 after the adjustment of the distance between the sensor substrate 25 and the sensor frame 22, the passage extending from the outside of the image sensor 21 to the sensor IC 9 is reliably sealed with the sealing member 28. Accordingly, the entry of foreign particulate matter into the image sensor 21 can be prevented.

In the second embodiment, the sensor substrate 25 is directly moved up and down. However, it is applicable that a member supporting the sensor substrate 25 be additionally arranged to move up and down the supporting member.

Also, in the second embodiment, the sealing member 28 having a fixed shape is arranged between the other end portion of the sensor substrate 25 and the sensor frame 22 to seal the passage extending from the outside of the image sensor 21 to the sensor IC 9. However, it is applicable that a gelatinous agent having no fixed shape be coated so as to seal the passage.

What is claimed is:

1. An image sensor comprising:
   a light source for illuminating a surface of a manuscript;
   a rod lens array for converging rays of light reflected on the surface of the manuscript;
   a light receiving element for receiving the rays of light converged by the rod lens array;
   a frame for fixing the rod lens array; and
   a holding and adjusting element for holding the light receiving element, adjusting a distance between the rod lens array and the light receiving element to arrange the light receiving element at an image forming position at which the rays of reflected light are converged so as to form an image drawn in the manuscript.

2. An image sensor according to claim 1, wherein the frame has both a first frame portion and a second frame portion separated from each other, and the rod lens array has a plane of incidence, a light emitting plane opposite to the plane of incident plane, a first side surface extending in parallel to a longitudinal direction and a second side surface opposite to the first side surface and is arranged between the first and second frame portions of the frame so as to make the first frame portion of the frame tightly come into contact with the first side surface of the rod lens array and so as to make the second frame portion of the frame tightly come into contact with the second side surface of the rod lens array.

3. An image sensor according to claim 1, wherein the frame has a long hole through which the rays of light emitted from the rod lens array pass, and the rod lens array tightly makes contact with a plane of the frame adjacent to a side of the long hole so as to cover the side of the long hole with the rod array.

4. An image sensor according to claim 1, wherein the holding and adjusting element comprises a plate-shaped member having a plate-shaped holding member for holding the light receiving element; and a plate-shaped adjusting member, which is connected with the plate-shaped holding member and makes contact with an end surface of the frame, for adjusting the position of the plate-shaped holding member by moving on the end surface of the frame, and a fixing member for fixing the plate-shaped adjusting member on the end surface of the frame at a plurality of fixing positions after the plate-shaped adjusting member is moved on the end surface of the frame to adjust the distance between the rod lens array and the light receiving element and to arrange the light receiving element at the image forming position.

5. An image sensor according to claim 4, wherein the plate-shaped adjusting member is fixed on the end surface of the frame at three fixing positions or more by the fixing member.

6. An image sensor according to claim 4, further comprising a sealing member, arranged between the plate-shaped holding member and the frame, to seal a passage extending from an outside of the image sensor to the light receiving element.

7. An image sensor according to claim 1, wherein the holding and adjusting element comprises a plate-shaped holding member for holding the light receiving element;

an adjusting member for supporting the plate-shaped holding member at a plurality of supporting positions and adjusting the distance between the plate-shaped holding member and the frame so as to arrange the light receiving element at the image forming position; and an elastic member, arranged between the plate-shaped holding member and the frame, for giving a resilient force to the plate-shaped holding member and the frame to make the plate-shaped holding member be apart from the frame.

8. An image sensor according to claim 7, wherein the plate-shaped holding member is supported by the adjusting member at three supporting positions or more.

9. An image sensor according to claim 7, further comprising a sealing member, arranged between the plate-shaped holding member and the frame, to seal a passage extending from an outside of the image sensor to the light receiving element.

* * * * *